United States Patent
Zwadlo

(10) Patent No.: US 8,530,142 B2
(45) Date of Patent: Sep. 10, 2013

(54) FLEXOGRAPHIC PRINTING PLATE PRECURSOR, IMAGING ASSEMBLY, AND USE

(75) Inventor: Gregory Lloyd Zwadlo, River Falls, WI (US)

(73) Assignee: Eastman Kodak Company, Rochester, NY (US)

( * ) Notice: Subject to any disclaimer, the term of this patent is extended or adjusted under 35 U.S.C. 154(b) by 157 days.

(21) Appl. No.: 13/047,968

(22) Filed: Mar. 15, 2011

(65) Prior Publication Data

US 2012/0237871 A1   Sep. 20, 2012

(51) Int. Cl.
*G03F 7/00* (2006.01)
*B41G 7/00* (2006.01)

(52) U.S. Cl.
USPC ............... 430/283.1; 430/270.1; 430/271.1; 430/273.1; 101/368

(58) Field of Classification Search
USPC ..................................... 430/270.1
See application file for complete search history.

(56) References Cited

U.S. PATENT DOCUMENTS

| | | | |
|---|---|---|---|
| 4,517,279 A | 5/1985 | Worns | |
| 4,622,088 A | 11/1986 | Min | |
| 4,686,172 A | 8/1987 | Worns et al. | |
| 4,689,290 A | 8/1987 | Worns | |
| 5,006,447 A | 4/1991 | Umeda et al. | |
| 5,039,592 A | 8/1991 | Umeda | |
| 5,593,811 A | 1/1997 | Loerzer et al. | |
| 5,645,963 A * | 7/1997 | Chang | 430/7 |
| 5,735,983 A | 4/1998 | Goss et al. | |
| 6,210,854 B1 | 4/2001 | Grossman et al. | |
| 6,436,499 B1 * | 8/2002 | Krampe et al. | 428/40.1 |
| 6,994,026 B2 | 2/2006 | De Voeght et al. | |
| 7,279,254 B2 * | 10/2007 | Zwadlo | 430/5 |
| 7,799,504 B2 | 9/2010 | Zwadlo et al. | |
| 7,802,598 B2 | 9/2010 | Zwadlo et al. | |
| 7,846,639 B2 | 12/2010 | Lungu | |
| 2005/0227182 A1 | 10/2005 | Ali et al. | |
| 2010/0143841 A1 | 6/2010 | Stolt et al. | |

FOREIGN PATENT DOCUMENTS

| | | |
|---|---|---|
| EP | 0 068 599 | 2/1985 |
| EP | 0 751 433 | 1/1997 |
| EP | 1 154 325 | 11/2001 |
| EP | 1 239 329 | 9/2002 |
| EP | 1239329 A2 * | 9/2002 |
| WO | 2006/124279 | 11/2006 |

* cited by examiner

*Primary Examiner* — Cynthia H Kelly
*Assistant Examiner* — Chanceity Robinson
(74) *Attorney, Agent, or Firm* — J. Lanny Tucker

(57) ABSTRACT

A flexographic printing plate precursor can be imaged and developed to provide a flexographic relief image. This flexographic printing plate precursor includes a radiation curable layer in which a flexographic relief image can be formed. It also includes a transparent release layer disposed on the radiation sensitive layer, which release layer consists essentially of a miscible mixture of a polyamide in an amount of at least 20 and up to and including 80 weight % and a natural or synthetic rubber latex in an amount of at least 20 and up to and including 80 weight %. The transparent release layer has a peel force in relation to an imaged film comprising a mask image of at least 50 and up to and including 200 g/inch. This precursor can be used in optical contact with the imaged film to form a relief image using curing radiation through the mask image.

9 Claims, No Drawings

FLEXOGRAPHIC PRINTING PLATE PRECURSOR, IMAGING ASSEMBLY, AND USE

FIELD OF THE INVENTION

This invention relates to a flexographic printing plate precursor having an improved release layer. It also relates to a flexographic printing plate imaging assembly including the precursor and an imaged film comprising a mask image. This invention also relates to a method of forming a flexographic relief image.

BACKGROUND OF THE INVENTION

Flexographic printing plate precursors having a laser-ablatable mask layer on its surface are known in the art. A relief image can be produced in such precursors without the use of a digital negative image or other imaged element or masking device. Films with a laser-ablatable mask layer can be formed by first imagewise exposing the film with laser radiation (generally an infrared radiation laser under computer control) to selectively remove the mask layer in the exposed areas. The mask-containing film is then placed in contact with a radiation-sensitive flexographic printing plate precursor and subjected to overall exposure with actinic radiation (for example, UV radiation) to cure the precursor in the unmasked areas and thus form a negative image of the mask in the precursor. The non-exposed regions of the precursor are then removed using a suitable organic solvent developer to provide a relief image where curing took place. After drying, the resulting relief image is useful in a flexographic printing plate.

An important advance in the art of making and using masking films is described in U.S. Patent Application Publication 2005/0227182 (Ali et al., herein cited as US '182). The described method provides a mask image in significantly less time due to greater imaging sensitivity. In some embodiments, a mask image is formed in a film that includes a carrier sheet and a release layer. The film with the mask image is brought into contact with a flexographic printing plate precursor that is then imaged through the mask image. The film with the mask image can be peeled off the release layer prior to development of the imaged precursor. Also, with the use of patterns as described in U.S. Patent Application 2010/0143841 (Stolt et al.), the peel force can be excessive due to the amount of contact edges in the imaged film.

U.S. Pat. No. 7,802,598 (Zwadlo et al.) describes a lamination device that can be used to prepare flexographic printing plates in which a film with a mask image is laminated with a flexographic printing plate precursor prior to imaging. The device is used to apply optimal force to ensure optical contact while minimizing lateral film distortion.

U.S. Pat. No. 7,279,254 (Zwadlo) describes a method for preparing relief images in flexographic printing plates using a removable imaged film containing a mask image. This imaged film is laminated or otherwise brought into optical contact with a flexographic printing plate precursor that includes a photosensitive material and a transparent releasing layer that is composed of, for example, a polyamide. The photosensitive material is exposed to curing radiation through the mask image and the imaged film is peeled off at the release layer. The imaged precursor is then developed to remove non-exposed regions as well as the release layer to form the desired relief image.

There remains a need to improve the methods of making flexographic printing plates using a release layer between the imaged film and flexographic printing plate precursor the flexographic printing plate assembly. Sometimes peeling off the imaged film leaves residual material from that imaged film on the imaged precursor and this inhibits its development. To minimize this problem, peeling should be done very slowly while the flexographic printing plate assembly is held down. Obviously, this lengthens the time for providing the desired relief image. There is a need for a more efficient process for providing flexographic printing plates.

SUMMARY OF THE INVENTION

The present invention provides a flexographic printing plate precursor that can be imaged and developed to provide a flexographic relief image, the flexographic printing plate precursor comprising:

a radiation curable layer in which a flexographic relief image can be formed, and a transparent release layer disposed over the radiation sensitive layer, the release layer consisting essentially of a miscible mixture of a polyamide in an amount of at least 20 weight % and up to and including 80 weight % and a natural or synthetic rubber latex in an amount of at least 20 weight % and up to and including 80 weight %, both amounts based on the transparent release layer dry weight, and wherein the transparent release layer has a peel force in relation to an imaged film comprising a mask image of at least 50 g/inch and up to and including 200 g/inch (at least 19.7 g/cm and up to and including 78.7 g/cm).

This invention also provides a flexographic printing plate imaging assembly comprising:

a) an imaged film comprising a mask image, and b) in optical contact with the imaged film, a flexographic printing plate precursor that can be imaged and developed to provide a flexographic relief image, the flexographic printing plate precursor comprising:

a radiation curable layer in which a flexographic relief image can be formed, and a transparent release layer disposed over the radiation sensitive layer, the release layer consisting essentially of a miscible mixture of a polyamide in an amount of at least 20 weight % and up to and including 80 weight % and a natural or synthetic rubber latex in an amount of at least 20 weight % and up to and including 80 weight %, both based on the transparent release layer dry weight, and the transparent release layer has a peel force in relation to the imaged film comprising a mask image of at least 50 g/inch and up to and including 200 g/inch (at least 19.7 g/cm and up to and including 78.7 g/cm).

Further, a method for preparing a flexographic printing plate with a relief image comprises:

imagewise exposing an imageable film comprising a transparent substrate and an imageable layer disposed on the substrate, to imaging radiation to form an imaged film comprising a mask image on the transparent substrate, bringing the imaged film comprising the mask image into optical contact with the transparent release layer of a flexographic printing plate precursor of this invention, exposing the flexographic printing plate precursor to curing radiation through the mask image to form an exposed precursor having an imagewise cured layer, removing the imaged film comprising the mask image from the exposed precursor at the interface of the imaged film and the release layer, and developing the exposed precursor to provide a flexographic printing plate having a relief image having a depth of at least 100 µm.

In some embodiments, the method of this invention further comprises:

bringing the imaged film comprising the mask image into contact with the transparent release layer of one or more additional flexographic printing plate precursors of the present invention, in sequence, exposing the one or more additional flexographic printing plate precursors to curing radiation through the mask image to form one or more additional exposed precursors, each having an imagewise cured layer, removing at least 95% of each imaged film comprising the mask image at the interface of the imaged film and the release layer, and developing the one or more additional exposed precursors to provide one or more additional flexographic printing plates having a relief image having a depth of at least 100 μm.

This invention provides an improved release layer for peeling apart the imaged film containing the mask image and the imaged flexographic printing plate precursor. The imaged film can be peeled away from the precursor more quickly and completely, leaving little is no residual material. This effect provides more rapid development of the imaged precursor as there is little or no residual material to inhibit the development process. Because peeling is easier, minimal handling and hold down pressure is needed with the flexographic imaging assembly and the process can be readily carried out at room temperature. Thus, heating during the curing process is not needed.

The transparent release layer used in the flexographic printing plate assembly comprises a unique combination of materials so that peeling away of the imaged film can be quick and complete. By "complete", at least 95% of the imaged film is peeled off, leaving very little or no residual material. The transparent release layer composition consists essentially of a miscible mixture of a polyamides in an amount of at least 20 weight % and up to and including 80 weight % and a natural or synthetic rubber latex in an amount of at least 20 weight % and up to and including 80 weight %, both amounts based on the transparent release layer dry weight. This composition provides a peel force in relation to an imaged film comprising a mask image of at least 50 g/inch and up to and including 200 g/inch (at least 19.7 g/cm and up to and including 78.7 g/cm).

The details of the transparent release layer and other components and method used in the present invention are described below.

DETAILED DESCRIPTION OF THE INVENTION

Definitions

Unless otherwise indicated, the terms "flexographic printing plate precursor" or "precursor" refer to embodiments of the present invention.

The terms "imaged film" or "film" refer to imageable elements that can be imaged to form a mask image.

Unless otherwise indicated, percentages are by weight.

The terms "laser-ablative" and "ablative" refer to an imageable layer of the film can be imaged using a thermal ablating means such as laser radiation that causes rapid local changes in the imageable layer thereby causing the material(s) in the imageable layer to be ejected from the layer.

The term "optical contact" refers to two layers or two elements (as in the case of the imaged film and flexographic printing plate precursor) are in intimate contact so that there is essentially no air-gap or void between the contacted surfaces, thus providing an "air-free interface". More precisely, two surfaces are defined as being in optical contact when the reflection and transmission characteristics of their interface are essentially fully described by the Fresnel laws for the reflection and transmission of light at the refractive-index boundary.

Flexographic Printing Plate Precursors

Considerable details of flexographic printing plate precursors that can be imaged and developed to provide flexographic relief images are provided in U.S. Patent Application Publication 2005/0227182 (Ali et al.) and U.S. Pat. No. 7,279,354 (Zwadlo), both of which are incorporated herein by reference. Such precursors generally include a suitable dimensionally stable substrate, at least one radiation curable layer in which a flexographic relief image can be formed, a transparent release layer, and optionally a cover sheet or metal layer.

Suitable substrates include flexible, dimensionally stable transparent polymeric films as well metal substrates such as aluminum sheets. Polyester films are particularly useful as flexible, dimensionally stable, transparent substrates.

The radiation curable layer on the substrate can be positive- or negative-working, but typically, it is negative-working and generally includes a visible- or UV-sensitive layer containing a visible-radiation or UV-radiation curable composition that is cured or hardened by polymerization or crosslinking upon exposure to the curing radiation. For example, the radiation-sensitive element can be UV-sensitive. The radiation curable layer can comprise one or more polymeric (for example elastomeric) binders, at least one photopolymerizable or curable monomers, and a photoinitiator that is sensitive to non-infrared radiation (for example, UV or visible radiation-sensitive). Examples of suitable initiator compositions are described in U.S. Pat. No. 4,323,637 (Chen et al.), U.S. Pat. No. 4,427,749 (Gruetzmacher et al), and U.S. Pat. No. 4,894,315 (Feinberg et al.), all incorporated herein by reference.

Thus, the flexographic printing plate precursor can have a radiation curable layer that comprises an ultraviolet (UV) sensitive curable material to render the radiation curable layer curable using ultraviolet radiation.

The elastomeric binders can be one or more polymers that are soluble, swellable, or dispersible in an organic solvent developer. Some of these binders can be soluble, swellable, or dispersible in aqueous developers. Many such binders are described in the references cited U.S. Pat. No. 7,279,254 (noted above, Col. 19, lines 7ff), and include for example, natural or synthetic polymers of conjugated diolefin hydrocarbons, including polyisoprene, 1,2-polybutadiene, 1,4-polybutadiene, butadiene/acrylonitrile, butadiene/styrene thermoplastic-elastomeric block copolymers. The polymeric binders are generally present in the in the radiation curable layer in an amount of at least 65 weight % based on the dry layer weight. The term "binder" also includes core-shell microgels and blends of microgels and preformed macromolecular polymers.

The radiation curable layer also generally includes one or more monomers that must be compatible with the elastomeric binder(s) to the extent that a clear, non-cloudy radiation curable layer is produced. Monomers that can be used in an UV curable layer are known in the art and include but are not limited to, addition polymerization ethylenically unsaturated compounds having relatively low molecular weights (generally less than 30,000 Daltons). Examples of suitable monomers include various mono- and polyacrylates, acrylate derivatives of isocyanates, esters, and epoxides. Specific monomers are described in Col. 19, lines 40-62 of U.S. Pat. No. 7,279,254 (noted above) and in references cited therein.

The one or more monomers are generally present in an amount of at least 5 weight % of the total dry radiation curable layer weight.

The photoinitiator can be a single compound or combination of compounds that are sensitive to visible or UV radiation and that generate free radicals that initiate the polymerization of the monomer(s) without excessive termination and are generally present in an amount of at least 0.001 weight % and up to and including 10 weight % based on the total dry weight of the radiation curable layer. Examples of suitable photoinitiators include substituted or unsubstituted polynuclear quinines and further details are provided in Col. 20, lines 1-9 in U.S. Pat. No. 7,279,254 (noted above) and in references cited therein.

The radiation curable layer can include other addenda that provide various properties including but not limited to, sensitizers, plasticizers, rheology modifiers, thermal polymerization inhibitors, tackifiers, colorants, antioxidants, antiozonants, and fillers.

The thickness of the radiation curable imageable layer can vary depending upon the type of relief image that is desired. In some embodiments, a UV-curable layer can at least 500 and up to and including 6000 µm, or typically at least 500 µm and up to and including 2500 µm, in thickness.

In some embodiments, the commercially available flexographic printing plate precursors include but are not limited to, FLEXCEL™ flexographic elements available from Kodak Polychrome Graphics, a subsidiary of Eastman Kodak Company (Norwalk, Conn.), CYREL® Flexographic plates available from DuPont (Wilmington, Del.), NYLOFLEX® FAR 284 plates available from BASF (Germany), FLEXILIGHT CBU plate available from Macdermid (Denver, Colo.), and ASAHI AFP XDI available from Asahi Kasei (Japan).

The flexographic printing plate precursor can include a metal layer disposed between the substrate and the radiation curable layer. This metal layer can include copper or another metal or metal alloy.

A transparent release layer is disposed over the radiation curable layer. In most embodiments, the transparent release layer is disposed directly on the radiation curable layer. The transparent release layer facilitates removal of the imaged film (described below) from the radiation curable layer after radiation curing. The transparent release layer allows at least 90% of incident radiation to pass through it, and thus it does not significantly absorb or scatter curing radiation. At room temperature (about 18-25° C.), the transparent release layer allows full removal of the mask image in the imaged film but does not provide full removal of the imaged film at higher temperatures.

The transparent release layer can also protect the radiation curable layer from fingerprinting or other damage and can be disposed over the radiation over the radiation curable layer and under a cover sheet if present. The transparent release layer can also be referred in the art as an "anti-tack layer", "separation layer", "slip layer", or "protective layer". This transparent release layer has a peel force in relation to an imaged film (described below) comprising a mask image of at least 50 g/inch and up to and including 200 g/inch (at least 19.7 g/cm and up to and including 78.7 g/cm). This peel force value can be measured in which a 2.54 cm wide by 25.4 cm long strip of imaged film that is laminated, release layer down, to a flexographic printing plate that has been UV exposed is mounted on an IMASS SP-2000 slip/peel tester (IMASS Inc., Accord, Mass.) using double stick tape with the printing plate down. The initial edge of the imaged film is pulled away from the printing plate and mounted in the force gauge. The maximum peel force in g/linear inch (2.54 cm) width of film is measured at a 180° peel angle and a peel speed of 2 cm/sec.

The transparent release layer and radiation sensitive layer are processable in the same organic solvent developer, examples of which are selected from the group consisting of aromatic or aliphatic hydrocarbons, aromatic or aliphatic halohydrocarbon solutions, or mixtures of such organic solvents, with or without suitable alcohols. Other useful developers are described below.

The transparent release layer has only two essential components that form a miscible mixture of a polyimide in an amount of at least 20 weight % and up to and including 80 weight % and a natural or synthetic rubber latex in an amount of at least 20 weight % and up to and including 80 weight %, both amounts based on the transparent release layer dry weight. Other addenda can be present, but the presence of these two particular components enables the transparent release layer to be readily peeled from an imaged film.

However, while they are not essential to performance of the invention, other polymers can be present in the transparent release layer. Such optional polymers include but are not limited to, poly(vinyl alcohol), a cellulosic polymer such as methyl cellulose, cellulose acetate butyrate, and hydroxypropyl methylcellulose, poly(vinyl butyral), copolymers of ethylene and vinyl acetate, and interpolymers as described in U.S. Pat. No. 4,293,635 (Flint et al.). The amount of these optional polymers in the transparent release layer is no more than 30 weight % based on total layer weight.

The transparent release layer has a dry thickness of at least 0.05 and up to and including 4 µm, or typically at least 0.1 µm and up to and including 2 µm. A thinner transparent release layer can be useful to obtain higher resolution image and make it easier to remove during the method of this invention.

The transparent release layer also contains a surfactant in an amount of at least 0.1 weight % based on transparent release layer dry weight. Useful surfactants include but are not limited to, an ethoxylate tetramethyl decynediol (available as SURFYNOL® 465 from Air Products and Chemicals), acetylenic diols compounded with other nonionic surfactants and solvents (available as SURFYNOL® GA from Air Products and Chemicals), ethoxylated castor oil (available as SURFACTOL® 365 from CasChem Inc.), and octylphenoxypolyethoxyethanol (available as Triton® X-100 from Dow Chemical, Inc.). Other useful additives include coating aids and release-enhancing materials.

Some embodiments also include a removable cover sheet that protects the radiation curable layer from fingerprints and other damage and that is disposed between the radiation-sensitive imageable layer and the cover sheet. In some embodiments, the flexographic printing plate precursor further comprises metal layer between the substrate and radiation curable layer, or both cover sheet and metal layer along with the radiation curable layer and transparent release layer.

Imageable Film

The flexographic printing plate precursor of this invention is used in conjunction with an imageable film to form a flexographic printing plate. This imageable film comprises an imageable layer disposed over a suitable substrate (or carrier sheet as described below), which imageable layer can be exposed to imaging radiation to form a mask image in the imageable layer. The imageable film comprises one or more layers, including one or more imageable layers disposed on a transparent substrate or carrier sheet. The imageable film can also include one or more other non-imageable layers including one or more of barrier, intermediate, adhesive, or other layers generally used in the art in masking films according to U.S. Patent Application Publication 2005/0227182 (noted above). Different constructions of the imageable film can be used in one or more different imaging methods.

The imageable layer(s) are generally disposed on a transparent layer (described below) as relatively uniform coatings (that is, being substantially continuous and having fairly uniform thickness). In some embodiments, the imageable layer and a transparent layer underneath it are the only layers on the carrier sheet. In other embodiments, there are multiple layers including multiple imaging layers or an imageable layer with a barrier layer, intermediate, or other layer(s) as described below.

The components of the imageable layer(s) are chosen to be soluble or swellable in suitable flexographic printing plate developers including both chlorinated organic solvents and the non-chlorinated organic solvents described below that are used to create the relief image after exposure of the radiation curable layer to curable radiation through the imaged film having a mask image.

The imageable layer can also be disposed on a substrate as a relatively uniform coating (that is, substantially continuous and having a fairly uniform thickness). In some embodiments, the imageable layer is disposed directly as a single layer on the substrate. For example, laser ablatable material (such as binder) and a radiation absorber (such as an IR absorber) can be combined in the single layer. In other embodiments, the imageable material is composed in two or more separate imageable layers, for example an energy absorbing layer and a layer containing a radiation absorber in a layer adjacent to the energy absorbing layer.

The imageable layer can contain a colorant (dye or pigment) and a radiation absorber dispersed within one or more binders. Colorants can be present to absorb or block curing radiation such as by reflectance. As used herein, "colorant" refers to a component that substantially prevents the transmission of curing radiation through the mask image.

The colorant can be one or more dyes or pigments, or mixtures thereof that will provide desired spectral properties. It can be a particulate material that is dispersed within the polymeric binder(s) described below. For example, they can be black dyes or pigments such as carbon black, metal oxides, and other materials described for example in US '182 (noted above). It is useful that the pigments or dyes be substantially non-IR absorbing so that imaging of the radiation-sensitive element is not adversely affected. For example, the colorant can absorb UV or visible radiation, and in many embodiments, the colorant is an UV-absorbing dye.

In some embodiments, the colorant is a black dye or pigment that absorbs energy at substantially all wavelengths across the visible spectrum, for example from at least 350 nm and up to and including 750 nm. The black dye or pigment can be a mixture of dyes or pigments, or mixtures of both dyes and pigments that individually are or are not be black but when mixed together provide a neutral black color. For example, a mixture of NEPTUN Black, Blue Shade Magenta, and Red Shade Yellow pigment (available from BASF in Germany) that provide a neutral black color can be used. DISPERSAL CBJ (from Runnemade Dispersions KV of the UK) can also be suitable.

One suitable black pigment is carbon black of which there are numerous types with various particles sizes that are commercially available. Examples include RAVEN 450, 760 ULTRA, 890, 1020, 1250 and others that are available from Columbian Chemicals Co. (Atlanta, Ga.) as well as BLACK PEARLS 170, BLACK PEARLS 480, VULCAN XC72, BLACK PEARLS 1100 and others available from Cabot Corp.

The colorant(s) can be present in the imageable layer in an amount of at least 10 weight % and up to and including 50 weight %, and typically of at least 10 weight % and up to and including 40 weight %.

It can be desirable to combine the use of carbon black with a non-infrared absorbing black dye or pigment to reduce interference with the radiation and improve the quality of the resulting imaged masking film. Also suitable as a pigment is a non-carbonaceous particulate material such as metal particles or metal oxide particles.

The imageable layer(s) generally also includes one or more infrared radiation absorbers. In some embodiments, the colorant acts in this function also but in other embodiments, a separate compound is included for this purpose, that is, to sensitize the imageable layer(s) to imaging IR radiation. Thus, the infrared radiation absorber is sensitive to radiation in the range of at least 700 and up to and including 1500 nm and typically of at least 700 and up to and including 1200 nm. Examples of useful IR absorbers include but are not limited to, cyanine infrared radiation (IR) absorber dyes, carbon blacks, and metals such as aluminum.

Examples of suitable IR dyes include but are not limited to, azo dyes, squarilium dyes, croconate dyes, triarylamine dyes, thiazolium dyes, indolium dyes, oxonol dyes, oxazolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,569,603 (Furukawa), and U.S. Pat. No. 6,787,281 (Tao et al.), and EP Publication 1,182,033 (Fijimaki et al.). A general description of one class of suitable cyanine dyes is shown by the formula in paragraph [0026] of WO 2004/101280, incorporated herein by reference.

Near infrared absorber cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanate et al.). Suitable dyes can be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (DeBoer).

Useful IR absorbers include carbon blacks, some of which are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful.

The radiation absorber (for example IR absorber) is generally present in an amount to provide a transmission optical density of at least 0.5 and typically of at least 0.75 at the exposing wavelength. Generally, this is achieved by including at least 1 weight % and up to and including 20 weight % of the one or more radiation absorbers, based on the solids content of the imageable layer. For example, the IR absorber compound should be sufficient to produce transparent areas where the film is exposed to infrared radiation, meaning that such areas would have a transmission optical density of about 0.5 or less as measured using a suitable filter on a conventional densitometer.

In other embodiments, the radiation absorber can include an ultraviolet absorber that absorbs radiation of at least 150 nm and up to and including 400 nm. The UV absorber can be used as the only radiation absorber or in combination with an IR absorber compound.

The imageable layer can optionally include a fluorocarbon additive for enhancing transfer of a molten or softened film and production of halftone dots (that is, pixels) having well-defined, generally continuous, and relatively sharp edges. Examples of useful fluorocarbon additives and amounts are provided in [0087] to [0089] of US '182 (noted above).

Additional optional components of the imageable layer include but are not limited to, plasticizers, coating aids or surfactants, dispersing aids, UV absorbers, and fillers, all of which are well known in the art as described for example in [0094] to [0096] of US '182 (noted above).

All of the components described above for the imageable layer are dispersed in one or more polymeric binders (both synthetic and naturally occurring polymeric materials) that are capable of dissolving or dispersing the other components in the imageable layer. The one or more polymeric binders are generally present in an amount of at least 25 weight % and up to and including 75 weight %, and typically at least 35 weight % and up to and including 65 weight %, based on the total dry weight of the imageable layer.

While a wide variety of polymeric binders can be used, some advantages can be achieved by using certain "primary" polymeric binders in an amount of at least 50 weight %, and typically at least 70 weight % and up to and including 100 weight %, of the total polymeric binder weight. The useful polymeric binders are those into which various components can be incorporated and that are soluble in suitable coating solvents such as lower alcohols, ketones, ethers, hydrocarbons, and haloalkanes. The polymeric binders are also desirably soluble or swellable in the chosen developer (described below).

Useful polymeric binders include the materials described for example in [0081] to [0085] of US '182, which paragraphs are incorporated herein by reference. The polymeric binders can be known as "adhesive binders" as described for example in [0081] of US '182 (noted above). Examples of suitable adhesive binders include but are not limited to, acetyl polymers such as poly(vinyl butyral)s that can be obtained for example as BUTVAR® B-76 from Solution, Inc. (St. Louis, Mo.) and acrylamide polymers that can be obtained as MACROMELT 6900 from Henkel Corp. (Gulph Mills, Pa.). Pressure-sensitive adhesive polymers can also be used for this purpose.

Other useful binders are those that are easily thermally combustible and generate gases and volatile fragments at temperature less than 200° C. Examples of these binders are nitrocellulose, polycarbonates, polyurethanes, polyesters, polyorthoesters, polyacetals, and copolymers thereof (see U.S. Pat. No. 5,171,650 of Ellis et al., Col. 9, lines 41-50).

Useful polymeric binders are resins having hydroxyl groups (or hydroxylic polymers) as described in [0082] to [0084] of US '182 (noted above) and include for example poly(vinyl alcohol)s and cellulosic polymers (such as nitrocellulose). Still further secondary polymeric binders are non-crosslinkable polyesters, polyamides, polycarbamates, polyolefins, polystyrenes, polyethers, polyvinyl ethers, polyvinyl esters, and polyacrylates and polymethacrylates having alkyl groups with 1 and 2 carbon atoms.

Some other useful polymeric binders that have been found to be readily dissolved or dispersed in non-chlorinated organic solvents are described below. They can also be dissolvable or dispersible in chlorinated organic solvents also. Such useful classes of polymeric binders that meet these characteristics include but are not limited to, terpene resins, phenolic resins, aromatic hydrocarbon resins, polyurethanes (including polyether polyurethanes), long-chain acrylate and methacrylate resins. Useful terpene resins include but are not limited to the SYLVARES terpene resins such as SYLVARES TR-A25 terpene resin that is available from Arizona Chemical Co. (Jacksonville, Fla.). Useful phenolic resins include but are not limited to, novolac resins such as CK2500 and CK2400 novolac resins that are available from Georgia Pacific Resins (Atlanta, Ga.). Aromatic hydrocarbon resins include but are not limited to, NORSOLENE® resins such as NORSOLENE® S-155 resin that are available from Sartomer Co. (Warrington, Pa.). Useful polyurethanes include but are not limited to, SURKOPAK® 5245 and SURKOFILM® 72S polyurethane resins that are available from Tennants Inks & Coatings Supplies, Ltd. (Surrey, UK) and NeoRez 322 polyurethane resin that is available from DSM NeoResins (Wilmington, Mass.). Long chain acrylate and methacrylate resins include those vinyl polymers derived from one or more long chain acrylate or methacrylate monomers wherein the long alkyl chain has at least 3 carbon atoms. Such monomers include but are not limited to, iso-butyl methacrylate, n-butyl methacrylate, and mixtures thereof.

Useful polymeric binders are homopolymers and copolymers derived from at least iso-butyl methacrylate, n-butyl methacrylate, or mixtures thereof. Commercially available primary polymeric materials of this type include ELVACITE® 2045 and ELVACITE® 2046 polymers that are available from Lucite International (Cordova, Tenn.). For example, it was found that the commercial polymers available as SURKOPAK® 5245 polyurethane resin and SURKOFILM® 72S polyurethane resin, ELVACITE® 2045 polymeric material, and CK 2500 novolac resin are useful.

The imageable layer can further include plasticizers, coating aids, dispersing agents, UV absorbers, fillers, surfactants, fluorocarbons, and other additives as described in US '182 (noted above).

Carrier Sheet:

The carrier sheet for the imageable film can be any suitable transparent substrate. Useful carrier sheets include but not limited to, transparent polymeric films and sheets such as polyesters including poly(ethylene terephthalate), poly(ethylene naphthalate), and fluorine polyester polymers, polyethylene, polypropylene, polybutadienes, polycarbonates, polyacrylates, polyvinyl chloride and copolymers thereof, and hydrolyzed and non-hydrolyzed cellulose acetate. Generally, the carrier sheet is at least 20 µm and up to and including 200 µm thick. For example, a transparent poly(ethylene terephthalate) sheet sold under the name of MELINEX by DuPont Teijin Films (Hopewell, Va.) is suitable for this purpose.

If necessary, the carrier sheet surface can be treated to modify its wettability and adhesion to applied coatings. Such surface treatments include but are not limited to corona discharge treatment and the application of subbing layers. The carrier sheet can contain one or more "adhesion promoters" that improve adhesion between the carrier sheet and the next adjacent layer, whatever type of layer or whatever purpose that layer can have. Useful adhesion promoters include but are not limited to, gelatin, poly(vinylidene chloride), poly (acrylonitrile-co-vinylidene chloride-co-acrylic acid), and poly(ethylenimine).

Transparent Layer:

The imageable film can further includes a transparent layer that is generally comprised of one or more film-forming polymeric materials that collectively provide a refractive index that is lower than the refractive index of the carrier sheet (or any optional immediately adjacent layer between the transparent layer and the carrier sheet). This difference in refractive index can be as low as 0.04 and more typically at least 0.08. One skilled in the art can readily determine useful polymeric film-forming materials since there are hundreds of possible materials commercially available. To see if a given material is useful, its refractive index (if not already known from the art or trade literature), can be determined by, for example, precisely measuring the location of the interference maxima in the spectral scan of a thin, uniform film of the material over the required range of wavelengths. This refractive index can then be compared to that of the carrier sheet (or optional intermediate layer) whose refractive index is known in the art or can be determined using a known procedure such as that just described.

By "transparent", we mean that the transparent layer generally has a transmission optical density of less than 0.3, and is thus not considered opaque or even translucent. The transparent layer desirably has a refractive index that is at least 0.08 lower than the refractive index of the supporting film base.

Certain classes of film forming polymeric materials can be used include one or more fluoroelastomers such as those described in U.S. Pat. No. 5,176,972 (Bloom et al.). Other useful fluoroelastomers include fluoroolefins such as copolymers of vinylidene fluoride and hexafluoropropylene, terpolymers of vinylidene fluoride, hexafluoropropylene, and tetrafluoroethylene, mixtures of two or more of such polymers, or blend of such copolymers or terpolymers with polytetrafluoroethylene (PTFE) that can be provided as a latex. Some of these fluoroelastomers can be obtained from 3M Corporation, or they can be prepared by copolymerization of known monomers using known conditions as described for example in U.S. Pat. No. 5,176,972 (noted above). One specific copolymer of this type is available from 3M Corporation as Fluorel FC-2175.

Alternatively, the transparent layer can be composed of film-forming polymeric materials that do not of themselves have the desired refractive index, but various non-film-forming materials such as matting agents, fillers, microcapsules, or a salt, can be dispersed in the film-forming materials that act as binders, to provide the desired refractive index. Examples of such dispersed additives, are described in U.S. Pat. No. 2,481,700 (Kuan-han Sun et al.) that include but are not limited to, $NaBF_4$ and $NH_4BF_4$ dispersed in poly(vinyl alcohol), and $MgSiF_6$ dispersed in a suitable binder.

The transparent layer generally has a substantially uniform thickness of at least 0.25 μm and typically at least 0.4 μm and up to and including 10 μm. It is generally provided as a substantially uniform coating with little variation in thickness over its entire area.

The transparent layer can also contain adhesion promoters in addition to or alternative to those in the carrier sheet. Examples of useful adhesion promoters are polyethylenimine, poly(vinylidene chloride), and similar copolymers, and Fusabond (sold by Dupont). Adhesion promoters are chosen such that they are soluble in the coating solvent for the low refractive index material.

Intermediate Layer:

In some embodiments of this invention, the imageable film can include an "intermediate layer" disposed between the carrier sheet and the imageable layer. In some embodiments, the intermediate layer is directly disposed on the carrier sheet and between it and the transparent layer described above. In other embodiments, the intermediate layer is directly disposed onto the transparent layer and is between it and the imageable layer. The presence of an intermediate layer can be desirable to facilitate the transfer of a resulting mask image to the radiation-sensitive element. Generally, the intermediate layer is developable, dispersible, or easily removable after curing through the mask image or during subsequent processing (development) of the imaged element. Furthermore, the intermediate layer usually does not significantly absorb or scatter the curing radiation. For example, it usually does not include matte agents or other light scattering materials. If a coating solvent is used to coat the intermediate layer, the coating solvent is chosen such that during coating there is little intermixing between the transparent layer and the intermediate layer.

Representative coatings suitable for use as an intermediate layer include but are not limited to poly(vinyl alcohols) or similar polymers, cellulosic polymers such as methyl cellulose or hydroxypropyl methyl cellulose, poly(vinyl butyral), or hydrolyzed styrene maleic anhydride. In this invention, UV exposure is carried out through the carrier sheet so that the carrier sheet prevents oxygen migration.

The intermediate layer can be relatively thin and have a dry thickness of at least 0.1 μm and up to and including 10 μm.

In other embodiments, the intermediate layer is a thermally resistant polymer layer that has desired layer integrity and good release properties after thermal imaging. Thermally resistant polymers include but are not limited to, polyimides, polysulfones, polyether ethyl ketone, bisphenol-A terephthalate, poly(vinyl alcohols), and polyamides, and can be optimized to provide desirable release properties, curability, and developability.

The intermediate layer can also include crosslinking agents to improve release properties, coating aids, surfactants, and release-enhancing agents. Further details of useful intermediate layer compositions are provided in US '182 (noted above).

Barrier Layer:

The imageable film can also include a bather layer disposed between the transparent layer or intermediate layer (if present) and the imageable layer that can be used to prevent colorant migration into or thermal damage to the transparent or intermediate layers during the ablation process. In most embodiments, the barrier layer is disposed over the intermediate layer and under an imageable layer. Suitable barrier layers and their compositions are also described in US '182 (noted above) and references cited therein. For example, the barrier layer can include one or more polymer binders, particularly, "heat-combustible" polymer binders such as poly (alkyl cyanoacrylate)s and nitrocellulose, and particulate materials such as metal oxide particles (for example, iron oxide particles) to provide high optical density with respect to imaging or curing radiation. Metal oxide particles can be useful for ablative imaging because they can thermally decompose to generate propulsive gases.

The barrier layer can optionally include an infrared absorber, such as infrared absorbers (IR dyes) including cationic infrared-absorbing dyes and photothermal-bleachable dyes, and crosslinking agents such as melamine-formaldehyde resins, dialdehydes, phenolics, polyfunctional aziridines, isocyanates, and urea-formaldehyde epoxies to provide greater thermal resistance.

Other Imageable Film Components:

An adhesive layer can be present in the imageable film overlying the imageable layer(s) to enhance adhesion of the mask image to the radiation curable layer of the flexographic printing plate precursor. The adhesive layer can comprise a thermoplastic, thermal adhesive, or pressure-sensitive adhesive that is well known in the art.

Forming a Mask Image:

In the practice of this invention, a mask image is formed by producing exposed and non-exposed regions in the imageable film described above. The choice of imaging mechanism will determine the possible variations in forming the mask image, as described below.

Exposing the imageable film can be carried out in selected regions, otherwise known as "imagewise exposure". Both analog and digital methods can be used for imagewise exposure. In some embodiments, imagewise exposure can be accomplished using laser radiation from one or more lasers that are scanned or rasterized under computer control. Any suitable scanning device can be used including flat-bed scanners, external drum scanners, and internal drum scanners. Two or more lasers can scan different regions of the film simultaneously.

For example, the imageable film can be exposed to infrared radiation, for example, in the range of at least 700 nm and up to and including 1400 nm. Such imageable films can contain one or more infrared radiation absorber as described above to provide sensitivity to infrared radiation. In these embodiments, the imageable film can be suitably mounted to an infrared imager and exposed to the infrared radiation using an infrared laser such as a diode laser or Nd:YAG laser that can be scanned under computer control. Suitable infrared imagers include but are not limited to DESERTCAT 88 imagers available from ECRM (Tewksbury, Mass.) used in color proofing, TRENDSETTER imagesetters and ThermoFlex Flexographic CTP imagers available from Eastman Kodak Company (Burnaby, British Columbia, Canada) used for CTP lithographic plate applications and for imaging flexographic elements, DIMENSION imagesetters available from Presstek (Hudson, N.H.) useful for CTP lithographic plate applications, CYREL® Digital Imager (CDI SPARK) available from Esko-Graphics (Kennesaw, Ga.), and OMNISETTER imagers available from Misomex International (Hudson, N.H.) useful for imaging flexographic elements.

In other embodiments, the imageable film is exposed to visible laser light, for example in the range of at least 400 nm and up to and including 750 nm. Commercially available filmsetters and imagesetters can be used including but not limited to, ACCUSET Plus imagesetter (visible red laser diode, 670 nm) and ADVANTAGE DL3850 imagesetter (410 nm), SELECTSET 5000 imagesetter (HeNe, 630 nm), all available from Agfa-Gevaert (Belgium), LUXEL V-9600 (410 nm) available from Fuji Photo Film (Japan), and DIAMONDSETTER imagesetter (frequency-doubled Nd-YAG laser, 532 nm) available from Western Lithotech (St. Louis, Mo.).

In still other embodiments, the imageable film can be exposed to ultraviolet radiation by laser direct imaging in the range of at least 150 nm and up to and including 410 nm. Apparatus useful for such imaging include but are not limited to, DP-100 imagers available from Orbotech (Billerica, Mass.) and DIGIRITE 2000 imager available from Etec Systems (Tucson, Ariz.).

The step of forming the mask image can also include a step of removing either exposed or non-exposed regions of imageable layer from the transparent substrate or carrier sheet. In some embodiments, the exposed regions are removed, leaving a mask image on the transparent carrier sheet (and any transparent layer disposed thereon). For these embodiments, a receptor sheet can optionally be used for removal of unwanted portions of the imageable layer. Such a receptor sheet can be any suitable paper, transparent film, or metal sheet to which one or more coatings have been applied before irradiation of the films to facilitate transfer of the imageable layer to the receptor. After imaging, the receptor sheet can be removed from the film to reveal the mask image on the carrier sheet. A complementary image to the mask image can remain on the receptor sheet.

In other embodiments, a mask image is formed on the carrier sheet (and any transparent layer disposed thereon) by producing exposed and non-exposed regions of the imageable layer and other layers, and removing non-exposed regions of those layers.

In some embodiments, the mask image residing on the carrier sheet can be cured by subjecting it to heat treatment, provided that the transfer property of the mask image is not adversely affected. Heat treatment can be done by a variety of means including but not limited to, storage in an oven, hot air treatment, or contact with a heated platen or passage through a heated roller device. Heat treatment is not necessary for curing to take place.

In still other embodiments, a mask image can be formed as noted above and the exposed regions are transferred to a receptor sheet. The receptor sheet it then removed from the imaged film before the mask image is transferred to a flexographic printing plate precursor. Thus, the imageable film can be provided with a receptor sheet in contact with the imageable layer, or the imageable layer is contacted with a separate receptor sheet after imagewise exposure.

An assembly of the imageable film and receptor sheets can be imagewise exposed using suitable imaging radiation to form a mask image, as described below. Imagewise exposure causes imagewise transfer of imageable layer or colorant from the imageable film to the receptor sheet. After imaging, the imageable film can be removed from the receptor sheet to reveal the mask image on the receptor sheet.

Several imaging mechanisms are mentioned briefly below and further details are provided by US '182 (noted above) and references cited therein beginning with paragraphs [0142].

Ablation:

In this mechanism, exposed regions of the imageable layer are removed from the imaged film by the generation of a gas, leaving a mask image. Specific binders that decompose upon exposure to heat (such as IR laser irradiation) to rapidly generate a gas can be used. This action is to be distinguished from other mass transfer techniques in that a chemical rather than a physical change cases an almost complete transfer of the imageable layer rather than a partial transfer.

Melt-Stick Technique:

The exposed areas of the imageable layer can be transferred in a molten or semi-molten state from the imaged film to a suitable receptor sheet upon exposure to radiation. The exposed areas are characterized by reduced viscosity that provides flowability to the imageable layer that flows across to and adheres to the surface of the receptor sheet with greater strength than it adheres to the carrier sheet (and transparent layer disposed thereon). Following this physical transfer, the carrier sheet, along with the non-transferred imageable layer, is separated from the receptor sheet.

In one embodiment, the mask image comprises the non-exposed regions remaining on the carrier sheet. In another embodiment, the mask image comprises the exposed regions of the imageable layer that are transferred to the receptor sheet.

Laser-Induced Film Transfer:

With this imaging mechanism, the exposed regions of the imageable layer are removed from the carrier sheet (and transparent layer disposed thereon) through laser-induced film transfer ("LIFT"). An intermediate layer containing a latent crosslinking agent is disposed between the carrier sheet and the imageable layer. The latent crosslinking agent reacts with the binder to form a high molecular weight network in the exposed regions to provide better control of melt flow phenomena, transfer of more cohesive material to the receptor sheet, and high quality edge sharpness of the mask image.

In one embodiment, the imageable layer includes a transferable colorant and an infrared absorbing dye (IR dye). In another embodiment, the imageable layer includes a transferable colorant, a polymeric binder as described above, a fluorocarbon additive, a cationic IR dye, and latent crosslinking agent as described above.

The mask image can comprise the non-exposed regions of the imageable layer remaining in the imaged film, but in other embodiments, the mask image comprises the exposed regions that are transferred to the receptor sheet.

Peel-Apart:

In this imaging mechanism, the exposed regions of the imageable layer are removed from the carrier sheet (and any transparent layer disposed thereon) using a suitable receptor sheet based differential adhesion properties in the imageable layer. After imagewise exposure of the imageable film, the receptor sheet is separated from the carrier sheet and either exposed or non-exposed regions remain in the imaged film.

Dye Sublimation or Diffusion:

In yet another imaging technique, colorant from exposed regions of the imageable layer is removed through sublimation wherein the colorant is diffused or sublimed without simultaneous transfer of the binder. A mask image can be generated in the film without the need for a receptor sheet. In other embodiments, a receptor sheet is used to capture the sublimed colorant. The mask image then comprises the imageable layer remaining in the imaged film. In still other embodiments, the mask image comprises the colorant that is transferred to a receptor sheet.

Alkaline Development of Mask:

The exposed regions of the imageable layer can also be removed by conventional alkaline development when the imaged film is washed with a suitable alkaline developer while non-exposed regions remain on the carrier sheet. The imageable layer is positive-working in this instance and can be composed of any of the known positive-working compositions. The developer has a pH of from about 9 to about 14 and generally comprises water and a hydroxide and other various addenda common to such solutions.

Alternatively, the non-exposed regions of the imageable layer can be removed from the imaged film to produce a mask image. Such imageable layer compositions are negative-working and become insoluble in the developer upon exposure. Useful developers for such materials generally have a pH of from about 7 to about 13 and include water-miscible high-boiling organic solvents and various addenda common to such solutions. Useful developers for these materials are well known and available from several sources including Eastman Kodak Company (Norwalk, Conn.).

Once the mask image has been formed, it is transferred to a suitable flexographic printing plate precursor (described above) that is sensitive to curing radiation (usually UV radiation). Mask image transfer includes placing the imaged film comprising the mask image onto the release layer of the flexographic printing plate precursor.

The imaged film comprising the mask image and the flexographic printing plate precursor are placed into such contact as to provide an air-free interface. Generally, this is achieved by laminating the film it to the flexographic printing plate precursor by applying pressure or heat, or both pressure and heat to form an air-free or gap-free interface. In many embodiments, this contact or lamination is carried out at room temperature, with or without pressure.

Commercially available laminators that can be used include but not limited to, KODAK® model 800XL APPROVAL LAMINATOR available from Eastman Kodak Company (Rochester, N.Y.), CODOR LPP650 LAMINATOR available from CODOR (Amsterdam, Holland), and LEDCO HD laminators available from Filmsource (Casselbury, Fla.). Other laminators that can be used at room temperature are described in U.S. Pat. No. 7,802,598 (noted above). A protective cover sheet, if present in the imaged film, is removed before lamination. The assembled imaged film with the mask image and flexographic printing plate precursor can be fed into the laminator at the desired speed, temperature, and pressure. A representative example of this process is described in the examples below.

Exposure of Flexographic Printing Plate Precursor

After an air-free contact is made between the imaged film with the mask image and the flexographic printing plate precursor as described above, the relief image-forming side of the precursor is exposed to curing radiation through the imaged film containing the mask image to form a cured layer in the exposed precursor having cured exposed regions. In this step, the curing radiation is projected onto the precursor through the mask image that preferentially blocks some of the curing radiation. In unmasked regions, curing radiation will cause hardening or curing of the imagewise radiation curable layer. The mask image should therefore be substantially opaque to the exposing radiation, meaning that the mask image should have a transmission optical density of 2 or more and typically 3 or more. The unmasked regions should be substantially transparent meaning that the unmasked regions of the precursor should have a transmission optical density of 0.5 or less and typically 0.1 or less. Transmission optical density can be measured using a suitable filter on a densitometer, for example, a MACBETH TR 927 densitometer.

Generally, exposure of the flexographic printing plate precursor through the imaged film containing the mask image is accomplished by floodwise exposure from suitable irradiation sources (for example, visible radiation or UV radiation). Exposure can be carried out in the presence of atmospheric oxygen. Exposure under vacuum is not necessary as air-free contact (or optical contact) has already been made.

Optionally, before exposure to curing radiation through the mask image, the flexographic printing plate precursor can be first exposed to curing radiation on the backside (non-relief forming side) and through a transparent support if present (known as "back exposure") to prepare a thin, uniform cured layer on the backside of the precursor. The backside exposure can be carried out either before or after contact is made between the imaged film and the precursor.

The wavelength or range of wavelengths suitable as the curing radiation for either or both relief image-forming and backside exposures can be dictated by the nature of the flexographic printing plate precursor. In some embodiments, the curing radiation is ultraviolet radiation at a wavelength of from about 340 to about 400 nm. Sources of visible or UV radiation for floodwise or overall exposure include but are not limited to, carbon arcs, mercury-vapor lamps, fluorescent lamps, electron flash units, and photographic flood lamps. Representative UV radiation sources include SYLVANIA 350 BLACKLIGHT fluorescent lamp (FR 48T12/350 VL/VHO/180, 115 watts) that has a central emission wavelength of about 354 nm that is available from Topbulb (East Chicago, Ind.), and BURGESS EXPOSURE FRAME, Model 5K-3343VSII with ADDALUX 754-18017 lamp available from Burgess Industries, Inc. (Plymouth, Mass.).

Other suitable sources of UV radiation include platemakers that are able to both expose the flexographic printing plate precursor to curing radiation and then to develop the imaged precursor. Examples of suitable platemakers include but are not limited to, KELLEIGH MODEL 310 PLATEMAKER available from Kelleigh Corporation (Trenton, N.J.) and the GPP500F PLATE PROCESSOR available from Global Asia Ltd. (Hong Kong).

The time for exposure through the mask image will depend upon the nature and thickness of the flexographic printing plate precursor and the source of the radiation. For example, in one of embodiment, a FLEXCEL-SRH flexographic printing plate precursor available from Eastman Kodak Company can be mounted on a KELLEIGH MODEL 310 PLATEMAKER and back exposed to UV-A radiation for about 20 seconds to prepare a thin, uniform cured layer on the backside of the precursor. A cover sheet, if present on the precursor, element is then removed from the relief image-forming side, and the imaged film containing the mask image is then brought into air-free contact with the precursor on the relief image-forming (front) side. The resulting assembly can then be exposed to a UV radiation through the mask image for about 14 minutes to form a cured image in the radiation curable layer that corresponds to the information used to form the mask image.

Once all exposing steps are completed, the imaged film containing the mask image is removed from the exposed flexographic printing plate precursor by peeling it away at the interface of the transparent release layer and the radiation curable layer. This peeling process can be carried out as described in U.S. Pat. No. 7,802,598 (noted above) using vacuum to hold the imaged printing plate in place. A corner of the imaged film is then pulled away from the printing plate at a rate of 2 to 10 cm/sec at peel angle of 150-180° (essentially pulling the imaged film back on itself and keeping the imaged film near the vacuum table surface) in a continuous motion until the entire imaged film is removed from the printing plate at the release layer surface. In the practice of this invention, at least 95 weight % of the dry imaged film (including the release layer) is removed in this operation, so that it can be generally said that the imaged film is "completely" or substantially completely removed from the exposed radiation curable layer of the precursor.

Relief Image Development

Once the imaged film including the transparent release layer is then removed, by any appropriate means, such as peeling, the exposed flexographic printing plate precursor is then generally developed with a suitable developer to form a relief image. Development serves to remove the uncured regions of the radiation curable layer, leaving the cured regions that define the relief image.

Any known developer for the imaged element can be used to remove the non-cured regions, including but not limited to, aromatic or aliphatic hydrocarbons, aromatic or aliphatic halohydrocarbons, or mixtures of such organic solvents, with or without suitable alcohols. Some useful developers are predominantly non-chlorinated organic solvents. By "predominantly", we mean that more than 50% (by volume) of the developer comprises one or more non-chlorinated organic solvents such as aliphatic hydrocarbons and long chain alcohols (that is alcohols with at least 7 carbon atoms). The remainder of the solutions can be chlorinated organic solvents, but typically, the chlorinated organic solvents comprise less than 50% (by volume) of the developer.

Certain useful developers are what are known as "perchloroethylene alternative solvents" (PAS). These developers are generally volatile organic compounds typically comprised of mixtures of aliphatic hydrocarbons and long-chain alcohols. They are generally stable under normal room temperature and storage conditions. Examples of such commercially available solvents include but are not limited to, PLATESOLV available from Hydrite Chemical Co. (Brookfield, Wis.), NYLOSOLV® available from BASF (Germany), FLEXOSOL® available from DuPont (Wilmington, Del.), OptiSol® available from DuPont (Wilmington, Del.), and SOLVIT® QD available from MacDermid (Denver, Colo.).

Other useful developers are described in U.S. Pat. No. 4,847,182 (Hoffmann et al.), U.S. Pat. No. 4,847,182 (Worns et al.), U.S. Pat. No. 5,061,606 (Telser et al.), U.S. Pat. No. 5,077,977 (Frass et al.), U.S. Pat. No. 5,312,719 (Schlosser et al.), U.S. Pat. No. 5,516,623 (Schlosser et al.), U.S. Pat. No. 5,521,054 (Takagi et al.), U.S. Pat. No. 5,578,420 (Takagi et al.), U.S. Pat. No. 6,162,593 (Wyatt et al.), U.S. Pat. No. 6,582,886 (Hendrickson et al.), U.S. Pat. No. 6,682,877 (Wyatt et al.), and U.S. Pat. No. 7,235,346 (Knöll et al), and the mixtures of diisopropylbenzene and aliphatic disbasic acid esters as described in U.S. Patent Application Publication 2011/0053090 (Fohrenkamm et al.), all of which publications are incorporated herein by reference. Still other useful developers are mixtures of water a water-miscible solvents such as alcohols, and diisopropylbenzene with or without an organic co-solvent. Combinations of the noted developer solutions can also be prepared and used in the invention.

Development is usually carried out under conditions such as for at least 5 and up to and including 20 minutes and at least 23 and up to and including 32° C. The type of developing apparatus and specific developer that are used will dictate the specific development conditions, and would be readily apparent to one skilled in the art.

Developers for preparing flexographic printing plates can also be reclaimed and recycled using various processes and apparatus as described for example in U.S. Patent Application Publication 2010-0213128 (Bradford et al.), U.S. Pat. No. 7,326,353 (Hendrickson et al.), and EP 430,233 (Yamamoto et al.).

Post-development treatment of the relief image can be suitable under some circumstances. Typical post-development treatments include drying the relief image to remove any excess developer and post-curing by exposing the relief image to curing radiation to cause further hardening or crosslinking. The conditions for these treatments are well known to those skilled in the art. For example, the relief image can be blotted or wiped dry, or dried in a forced air or infrared oven. Drying times and temperatures would be apparent to a skilled worker in the art. Post-curing can be carried out using the same type of radiation previously used for exposing through the mask image.

Detackification (or "light finishing") can be used if the relief image surface is still tacky. Such treatments, for example, by treatment with bromide or chlorine solutions or exposure to UV or visible radiation, are well known to a skilled worker.

The resulting relief image can have a depth of from about 2% to about 80% of the original thickness of the radiation curable layer. For example, the maximum depth is at least 100 µm, and typically is at least 100 µm and up to and including 2000 µm, or more typically of at least 400 µm and up to and including 1000 µm.

Development is also possible by using the thermal processes disclosed in U.S. Pat. No. 5,175,072 (Martens), U.S. Pat. No. 5,279,697 (Peterson et al.), and U.S. Pat. No. 6,998,218 (Markhart).

The method of this invention can also comprise:

bringing the imaged film comprising the mask image into contact with the transparent release layer of one or more additional flexographic printing plate precursors described above, after the first precursor has been imaged and processed to provide a relief image, in sequence, exposing the one or more additional flexographic printing plate precursors to curing radiation through the mask image to form one or more additional exposed precursors, each having an imagewise cured layer, removing at least 95% of each imaged film comprising the mask image at the interface of the imaged film and the release layer, and developing the one or more additional exposed precursors to provide one or more additional flexographic printing plates having a relief image having a depth of at least 100 μm.

The present invention provides at least the following embodiments and combinations thereof, but other combinations of features are considered to be within the present invention as a skilled artisan would appreciate from the teaching of this disclosure:

1. A flexographic printing plate precursor that can be imaged and developed to provide a flexographic relief image, the flexographic printing plate precursor comprising:

a radiation curable layer in which a flexographic relief image can be formed, and a transparent release layer disposed over the radiation sensitive layer, the release layer consisting essentially of a miscible mixture of a polyimide in an amount of at least 20 weight % and up to and including 80 weight % and a natural or synthetic rubber latex in an amount of at least 20 weight % and up to and including 80 weight %, both amounts based on the transparent release layer thy weight, and wherein the transparent release layer has a peel force in relation to an imaged film comprising a mask image of at least 50 g/inch and up to and including 200 g/inch (at least 127 g/cm and up to and including 508 g/cm).

2. The flexographic printing plate precursor of embodiment 1 wherein the transparent release layer and radiation sensitive layer are processable in the same organic solvent developer.

3. The flexographic printing plate precursor of embodiment 1 or 2 wherein the transparent release layer and radiation sensitive layer are processable in a developer solvent selected from the group consisting of aromatic or aliphatic hydrocarbons, aromatic or aliphatic halohydrocarbons, mixtures of aliphatic hydrocarbons and long-chain alcohols, mixtures of water and a water-miscible organic solvent, diisopropylbenzene with or without an organic co-solvent, and combinations of any of these developer solvents.

4. The flexographic printing plate precursor of any of embodiments 1 to 3 wherein the transparent release layer has a dry thickness of at least 0.05 μm and up to and including 4 μm.

5. The flexographic printing plate precursor of any of embodiments 1 to 4 wherein the radiation curable layer comprises an ultraviolet sensitive curable material to render the radiation curable layer curable using ultraviolet radiation.

6. The flexographic printing plate precursor of any of embodiments 1 to 5 wherein the radiation curable layer is disposed on a flexible substrate.

7. The flexographic printing plate precursor of embodiment 6 wherein the radiation curable layer is disposed on a flexible, dimensionally stable, transparent substrate.

8. The flexographic printing plate precursor of any of embodiments 1 to 7 further comprising a cover sheet, metal layer, or both cover sheet and metal layer.

9. The flexographic printing plate precursor of any of embodiments 1 to 8 wherein the transparent release layer also contains a surfactant in an amount of at least 0.1 weight % based on transparent release layer dry weight.

10. The flexographic printing plate precursor of any of embodiments 1 to 9 wherein the radiation sensitive layer comprises a total of at least 65 weight % of one or more polymeric binders that are soluble, swellable, or dispersible in an organic solvent developer.

11. A flexographic printing plate imaging assembly comprising:

a) an imaged film comprising a mask image, and b) in optical contact with the imaged film, a flexographic printing plate precursor of any of embodiments 1 to 10.

12. A method of preparing a flexographic printing plate with a relief image, the method comprising:

imagewise exposing an imageable film comprising a transparent substrate and an imageable layer disposed over the substrate, to imaging radiation to form an imaged film comprising a mask image on the transparent substrate, bringing the imaged film comprising the mask image into optical contact with the transparent release layer of a flexographic printing plate precursor of any of embodiments 1 to 10, exposing the flexographic printing plate precursor to curing radiation through the mask image to form an exposed precursor having an imagewise cured layer, removing the imaged film comprising the mask image from the exposed precursor at the interface of the imaged film and the release layer, and developing the exposed precursor to provide a flexographic printing plate having a relief image having a depth of at least 100 μm.

13. The method of embodiment 12 comprising removing at least 95% of the imaged film from the exposed precursor.

14. The method of embodiment 12 or 13 wherein the imaged film comprising the mask image is brought into contact with the transparent release layer of the flexographic printing plate precursor by laminating at room temperature.

15. The method of any of embodiments 12 to 14 wherein the imaged film comprising the mask image is brought into uniform physical contact with the transparent release layer of the flexographic printing plate precursor.

16. The method of any of embodiment 12 to 15 comprising exposing the flexographic printing plate precursor that comprises an ultraviolet or visible radiation curable material, to curing ultraviolet or visible radiation.

17. The method of any of embodiments 12 to 16 wherein developing is carried out using an organic solvent that solubilizes the non-cured portions of the radiation curable layer of the exposed precursor and the transparent release layer.

18. The method of embodiment 17 wherein developing is carried out using a developer solvent selected from the group consisting of aromatic or aliphatic hydrocarbons, aromatic or aliphatic halohydrocarbons, mixtures of aliphatic hydrocarbons and long-chain alcohols, mixtures of water and a water-miscible organic solvent, diisopropylbenzene with or without an organic co-solvent, and combinations of any of these developer solvents.

19. The method of any of embodiments 12 to 18 for providing a relief image in the flexographic printing plate having a depth in the range of at least 100 μm and up to and including 2000 μm.

20. The method of any of embodiments 12 to 19 wherein the imagewise exposing of the imageable film is carried out using laser ablation of an ablatable layer in the imageable film.

21. The method of any of embodiments 12 to 20 comprising exposing the flexographic printing plate precursor to curing radiation without vacuum drawdown.

22. The method of any of embodiments 12 to 21 further comprising:

bringing the imaged film comprising the mask image into contact with the transparent release layer of one or more additional flexographic printing plate precursors of any of embodiments 1 to 10, in sequence, exposing the one or more additional flexographic printing plate precursors to curing radiation through the mask image to form one or more additional exposed precursors, each having an imagewise cured layer, removing at least 95% of each imaged film comprising the mask image at the interface of the imaged film and the release layer, and developing the one or more additional exposed precursors to provide one or more additional flexographic printing plates having a relief image having a depth of at least 100 μm.

The following Examples are provided to illustrate the practice of this invention and are not meant to be limiting in any manner.

Invention Example 1 and Comparative Example 1

Macromelt® 6990 polyamide (10 g) was dissolved in toluene (90 g). Elmer's brand rubber cement containing a natural rubber latex (5 g) was separately dissolved in toluene (10 g). Three parts of the polyamide solution were mixed with one part of the rubber cement solution and coated onto an untreated poly(ethylene terephthalate) film (0.01 cm thickness) and dried at 100° C. for 1 minute to provide a coated transparent release layer having a coverage of about 1300 mg/m$^2$.

This release layer article was then laminated to the radiation curable layer of a commercial Flexcel™ NX flexographic printing plate precursor and heated at 100° C. for 30 seconds and the poly(ethylene terephthalate) film then served as a protective cover sheet.

A sheet of commercially available Kodak® imageable film was imaged to a standard test pattern on a Kodak® Trendsetter imaging device to form a mask image in the resulting imaged film.

This imaged film was then placed in a Flexcel™ NX laminating apparatus at room temperature. The precursor construction described above having the protective cover sheet and transparent release layer was also placed in the laminating apparatus, and the poly(ethylene terephthalate) cover sheet was removed, leaving the transparent release layer as the outermost radiation-curable layer of the precursor.

The imaged film containing the mask image was laminated to the transparent release layer of the precursor to form an assembly, and the precursor was imaged with UV radiation on the backside as well as through the mask image. While the assembly was still in the UV exposing apparatus, the imaged film containing the mask layer and the transparent release layer were peeled off the imaged precursor at a peel angle (150-180°) at a peel rate of about 10 cm/sec. A peel force of about 50-90 g/cm was observed, and complete removal of the imaged film and transparent release layer was observed (more than 95 weight %). No residue was observed on the surface of the imaged flexographic printing plate precursor. This surface had little tackiness.

The imaged precursor was then processed in a Kelleigh plate processor using Universal Solvent 1.0 for 10 minutes and dried to provide a desired relief image as the non-exposed regions in the radiation-curable layer (Invention Example 1). Plate dot retention and dot edge sharpness quality was very high, similar to the quality that is achieved using a commercial Flexcel™ NX flexographic printing plate precursor and the same procedure but without a transparent release layer (Comparative Example 1). Because a transparent release layer was not used with the Comparative Example 1, when the imaged film was peeled off the imaged flexographic printing plate precursor (before development), significant residue was observed on the radiation-curable layer surface, which residue was not removed during subsequent development.

Comparative Examples 2 and 3

The procedure described in Invention Example 1 was carried out except that the release layer comprised essentially only the Macromelt® 6990 polyamide (Comparative Example 2). Because the polyamide was non-tacky at room temperature, the imaged film with the release layer did not adhere well to the flexographic printing plate precursor. This resulted in poor contact between the imaged film containing the mask image to the flexographic printing plate precursor, or required a vacuum frame to force the imaged film and precursor together. This results in a loss in image sharpness. If the release layer was heated to improve the adhesive properties of the polyamide, other undesirable effects occur such as uneven heat distortion of the radiation curable layer.

In Comparative Example 3, the same procedure was used but the release layer contained only a synthetic rubber latex cement. When the imaged film was peeled from the precursor, the peel force was very high (in excess of 400 g/cm or 1016 g/cm) and much of the imaged film layer stuck to the release layer after peeling.

The invention has been described in detail with particular reference to certain preferred embodiments thereof, but it will be understood that variations and modifications can be effected within the spirit and scope of the invention.

The invention claimed is:

1. A flexographic printing plate precursor that can be imaged and developed to provide a flexographic relief image, the flexographic printing plate precursor comprising:
   a radiation curable layer in which a flexographic relief image can be formed, and
   a transparent release layer disposed over the radiation curable layer, the release layer consisting essentially of a miscible mixture of a polyamide in an amount of at least 20 weight % and up to and including 80 weight % and a natural or synthetic rubber latex in an amount of at least 20 weight % and up to and including 80 weight %, both amounts based on the transparent release layer dry weight, and
   wherein the transparent release layer has a peel force in relation to an imaged film comprising a mask image of at least 50 g/inch and up to and including 200 g/inch.

2. The flexographic printing plate precursor of claim 1 wherein the transparent release layer and radiation curable layer are processable in the same organic solvent developer.

3. The flexographic printing plate precursor of claim 1 wherein the transparent release layer and radiation curable layer are processable in a developer solvent selected from the group consisting of aromatic or aliphatic hydrocarbons, aromatic or aliphatic halohydrocarbons, mixtures of aliphatic hydrocarbons and long-chain alcohols, mixtures of water and a water-miscible organic solvent, diisopropylbenzene with or without an organic co-solvent, and combinations of any of these developer solvents.

4. The flexographic printing plate precursor of claim 1 wherein the transparent release layer has a dry thickness of at least 0.05 μm and up to and including 4 μm.

5. The flexographic printing plate precursor of claim 1 wherein the radiation curable layer comprises an ultraviolet sensitive curable material to render the radiation curable layer curable using ultraviolet radiation.

6. The flexographic printing plate precursor of claim 1 wherein the radiation curable layer is disposed on a flexible substrate.

7. The flexographic printing plate precursor of claim 6 wherein the radiation curable layer is disposed on a flexible, dimensionally stable, transparent substrate.

8. The flexographic printing plate precursor of claim 1 further comprising a cover sheet, metal layer, or both cover sheet and metal layer.

9. The flexographic printing plate precursor of claim 1 wherein the radiation curable layer comprises a total of at least 65 weight % of one or more polymeric binders that are soluble, swellable, or dispersible in an organic solvent developer.

* * * * *